United States Patent
Van Dalen et al.

(10) Patent No.: US 7,162,906 B2
(45) Date of Patent: Jan. 16, 2007

(54) METHOD AND APPARATUS FOR REMOVING A CARRIER PART FROM A CARRIER

(75) Inventors: Adrianus Wilhelmus Van Dalen, Nijmegen (NL); Henri Joseph Van Egmond, Eden (NL)

(73) Assignee: Fico B.V. (NL)

( * ) Notice: Subject to any disclaimer, the term of this patent is extended or adjusted under 35 U.S.C. 154(b) by 0 days.

(21) Appl. No.: 10/470,317

(22) PCT Filed: Jan. 29, 2002

(86) PCT No.: PCT/NL02/00068

§ 371 (c)(1),
(2), (4) Date: Dec. 3, 2003

(87) PCT Pub. No.: WO02/061822

PCT Pub. Date: Aug. 8, 2002

(65) Prior Publication Data

US 2004/0074353 A1    Apr. 22, 2004

(30) Foreign Application Priority Data

Jan. 29, 2001 (NL) .................................... 1017215
Jul. 11, 2001 (NL) .................................... 1018511

(51) Int. Cl.
*H01L 21/48* (2006.01)
(52) U.S. Cl. .............................. 72/331; 72/325; 83/694; 29/566.3; 140/105
(58) Field of Classification Search ................... 72/326, 72/334, 331, 327; 83/694; 29/835, 827, 29/566.2, 566.3; 140/105
See application file for complete search history.

(56) References Cited

U.S. PATENT DOCUMENTS

| 1,434,190 | A | * | 10/1922 | Bird | 72/329 |
| 3,211,034 | A | * | 10/1965 | Raimund | 82/137 |
| 3,656,379 | A | * | 4/1972 | Clark | 409/304 |
| 4,362,902 | A | * | 12/1982 | Grabbe | 174/52.4 |
| 5,458,158 | A | * | 10/1995 | Kawanabe | 140/105 |
| 6,401,510 | B1 | * | 6/2002 | Morse et al. | 72/327 |

FOREIGN PATENT DOCUMENTS

| DE | 25 26 318 A | 12/1976 |
| JP | 58 090750 A | 5/1983 |
| JP | 06 005758 A | 1/1994 |
| JP | 07 0225544 A | 1/1995 |
| JP | 08 204091 A | 8/1996 |
| JP | 09 223706 A | 8/1997 |
| JP | 00 307046 A | 11/1997 |
| JP | 2000 216318 A | 8/2000 |

* cited by examiner

*Primary Examiner*—Daniel C. Crane
(74) *Attorney, Agent, or Firm*—The Webb Law Firm

(57) ABSTRACT

A method for removing from a carrier a carrier part with a housing arranged thereon, wherein prior to performing the separating operation a notched line is arranged in the carrier on at least one side of the carrier along at least a part of the length of a separating edge to be arranged. The invention also relates to a carrier part with a housing arranged thereon, which carrier part contains openings on the side of the carrier remote from the housing which are filled with encapsulating material, manufactured with the present method. The invention moreover relates to an apparatus for performing the method.

16 Claims, 4 Drawing Sheets ic chips, the components are usually placed on a carrier, on which carrier the components are then encapsulated with for instance a synthetic resin or epoxy.
METHOD AND APPARATUS FOR REMOVING A CARRIER PART FROM A CARRIER This application is a 371 of PCT/NL02/00068, filed Jan. 29, 2002.

The invention relates to a method for removing from a carrier a carrier part with a housing arranged thereon. The invention also relates to an apparatus for removing from a carrier a carrier part with a housing arranged thereon. The invention moreover provides a product removed from a carrier in accordance with the method.

DESCRIPTION OF THE RELATED ART

In the production of electronic components, such as for instance semiconductor chips, the components are usually placed on a carrier, on which carrier the components are then encapsulated with for instance a synthetic resin or epoxy. The thus manufactured encapsulated components are subsequently released with a part of the carrier from the carrier. For this purpose a cutting plate engages the carrier on one side, in which plate are arranged recesses of the size of the carrier parts for separating. By means of one or more cutting members ("cutting punches"), likewise roughly the size of the carrier parts for separating, the carrier parts for separating are engaged on the side remote from the cutting plate and pressed by the cutting plate. Particularly in the separating of so-called "leadless packages", also referred to as BLP components (bottom lead packages), this existing method of separation results in problems. Since the underside of such carriers contains openings which are also filled with encapsulating material, the cutting plate supports the carrier, but there are also encapsulating material surfaces which adjoin the cutting plate. These surfaces formed by encapsulating material are to a limited extent generally more elevated than the underside of the carrier. As a result the surfaces formed by the encapsulating material are not properly supported by the cutting plate, whereby crack formation will occur in the encapsulating material when the separating operation is performed. This is undesirable. Other drawbacks of the existing method is the forming of burrs on the underside of the separated carrier parts. This causes problems in the further processing of the separated components. While the problem of burr formation can be solved by reversing the separation process relative to the carrier, this causes problems in the placing of the cutting plate. There is generally only very little space available adjacently of the encapsulated components for engaging on the carrier, so that the cutting plate has to have a complex form with contact surfaces of very limited size. This reduces the tool life of such a cutting plate and can result in damage to the carrier material.

The object of the present invention is to improve the result of a separating operation, wherein particularly crack formation in a component for processing and burr formation will occur less or will be less of a problem.

SUMMARY OF THE INVENTION

The invention provides for this purpose a method for removing from a carrier a carrier part with a housing arranged thereon, wherein prior to performing the separating operation a notched line is arranged in the carrier on at least one side of the carrier along at least a part of the length of a separating edge to be arranged. The arranging of a notched line creates a weakened line in the carrier and the encapsulating material at the position where the separating edge must be arranged. The consequence hereof is that it will be possible to carry out the actual separation with less force and that the boundaries of the separating edge are precisely defined. The danger of cracking in the encapsulating material is hereby eliminated. Another significant advantage is that a burr possibly formed during separation will not protrude relative to a flat side of the separated carrier part. A burr will form at the position of the part of the separating edge which is not defined by the notched line. As a result the burr will not be formed adjacently of a flat side of the carrier part; the separating edge is after all formed there by the notched line.

The notched line is preferably arranged by pressing a notching tool into the carrier, wherein the notched line has a depth which is less than the thickness of the carrier. More preferably still, notched lines are arranged on two sides of the carrier at the position of the separating edge to be arranged. Pressing a notched line into the carrier with a notching tool is a very simple operation. The form of the notching tool determines the form of the notched line to be made. When the notched line is arranged it is only necessary to take care that the notched line reaches the desired depth. A strengthened effect, particularly in respect of weakening the material, is obtained when the carrier is provided with a notched line on two sides. An additional advantage herein is that the positioning of the notched line is also determined even more precisely.

In yet another preferred embodiment the separating operation is performed with a cutting member engaging on one side of the carrier and a cutting plate engaging on the opposite side of the carrier, such that the mutual distance between the cutting member and the cutting plate during performing of the separating operation is greater than the usual dimension of the mutual distance between the cutting member and the cutting plate, for instance at least 0.025 mm, preferably 0.04 mm. Since the positioning of the separating edge is defined for the greater part by the notched line(s), the mutual distance between the cutting member and the cutting plate can be greater than according to the prior art without this causing problems. The consequence hereof is that there will be less wear of the cutting member and the cutting plate owing to use. The result is that the lifespan of the cutting member and the cutting plate increases.

The invention furthermore provides a preferred variant of the method, wherein the carrier is preferably placed on one side on a first cutting element provided with a recess and a second cutting element having a cutting edge with dimensions which correspond with the dimensions of the recess in the first cutting element is moved to the first cutting element. In this method the projecting cutting edge of a cutting element is preferably pressed the contact side of the carrier with the cutting element. This single operation, wherein the deforming and the actual separation take place in a single stroke of the cutting elements, results n a controlled separation process. After applying the single-sided or double-sided deformation in the carrier the separation need be made over a thickness smaller than the thickness of the carrier. In the ideal case the separation will take place from the position where the carrier is most deformed (the deepest part of the imprint) to the other side of the carrier (the deepest part of the imprint on the opposite side or, if there is no second imprint, to the opposite side). Since this path which the separation has to cover is shorter than the thickness of the carrier and because the separation tends to occur connecting into a deformation (the source), the position of the separation can be more readily controlled if the carrier is already deformed prior to the start of the actual separation process. The danger of crack formation in the encapsulating material is hereby also eliminated; during the actual separation a carrier part for separating lies against the cutting edge along the whole length of the cutting edge despite the often more elevated openings filled with encapsulating material. The standing cutting edge is pressed so far into the carrier that at the position of a cutting line both the carrier itself and the encapsulating material in the openings arranged in the carrier lie against the cutting edge. Cracks in the encapsulating material are thus prevented. It is noted that the standing cutting edge preferably does not penetrate into the encapsulating material during deforming of the carrier but precisely that this edge comes to lie against the encapsulating material.

The single separating operation according to the invention has the additional advantage that possible burrs occurring during the separation do not protrude, or hardly so, relative to the flat sides of the carrier. The possible burrs will anyway develop at a distance from the flat sides of the carrier; in the most unfavourable case at the position where the deformation applied by the cutting edge ends. Because possible burrs occur at a distance from the flat sides of the carrier, in normal conditions they will not protrude outside the surfaces defined by the flat sides of the carrier. These possible burrs do not therefore form a problem in the further processing of the separated carrier parts.

Another advantage of the method according to the invention is that it is relatively clean. The first deformation of the carrier creates no fragments or other free material portions, or hardly so. The actual separation path, on which path free material portions will occur, is shortened owing to the at least one deformation, so that here also less contamination will occur than in conventional separation. A further advantage of the preferred variant of the method according to the invention is that it is a single operation which is comparatively not very labour-intensive. Repositioning of the carrier after a first processing step is also unnecessary. These aspects make the present preferred method reliable and little susceptible to malfunction.

After performing of the separating operation the cutting elements are preferably moved apart and the separated carrier part is released from the cutting elements, wherein one side of the carrier part connecting onto the separation edge is provided with a deformation. A carrier part (product) manufactured with the method according to the invention can thus be easily identified. The separated carrier part also forms an independent part of the present invention. Such a carrier part is preferably provided with a deformation on the side of the carrier remote from the housing connecting onto the separation edge.

The invention also provides an apparatus for removing from a carrier a carrier part with a housing arranged thereon. The notching means are preferably coupled to drive means for displacing the notching means relative to a carrier placeable in the apparatus. An existing separating apparatus only required limited adjustment to make it suitable for performing the method according to the present invention. The advantages as described above can thus be obtained with minimal investment; only the arrangement of notching means with optionally separate drive means for displacement thereof are sufficient.

For arranging of notched lines on two sides in the carrier the notching means can comprise at least two notching members displaceable relative to each other for engaging on two opposite sides of a carrier. Notched lines can thus be arranged on both sides in a short time without the notching means having to be displaced from the one to the other side of the carrier. In a preferred embodiment the notching means consist of at least one notching member with a sharp notching edge.

In order to simplify the construction of the separating apparatus the means for positioning the carrier are formed by the cutting plate. The cutting plate thus fulfills a dual function, whereby separate positioning means are unnecessary. For controlled displacement the notching means can be displaced by means of control means, such as for instance an automated control.

The invention also provides an apparatus for removing a carrier part from a carrier. An existing separating apparatus need only be modified in limited manner to make it suitable for performing the method according to another embodiment of the present invention, only at least one of the cutting elements need be provided with a standing cutting edge. In addition, it can be advantageous to also modify the control of the cutting elements. For optimal results the relative displacement speed of the cutting elements during the deformation will generally differ from the relative displacement speed of the cutting elements during the separation. The advantages as described above can thus be obtained with minimum investment.

Good results are achieved particularly when the projecting cutting edge has a form angled toward the base of the cutting element. Advantageous results are also achieved when the projecting cutting edge comprises an edge running substantially parallel to a carrier and a sloping part connecting thereto and having a form angled toward the base of the cutting element. For a further improvement in results, the apparatus will generally comprise means for positioning the carrier, which means can be integrated with the cutting plate.

BRIEF DESCRIPTION OF THE DRAWINGS

The present invention will be further elucidated with reference to the non-limitative embodiments shown in the following figures. Herein.

DETAILED DESCRIPTION OF THE
PREFERRED EMBODIMENTS

Figure 1:
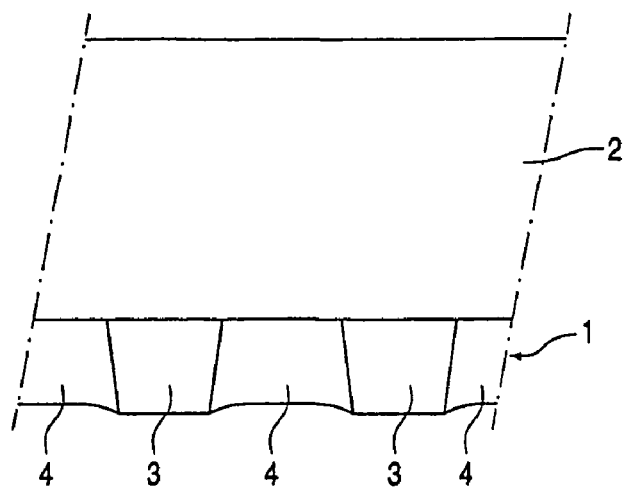
FIG. 1 shows a side view of a part of a carrier on which a separating operation is performed.

FIG. 1 shows a side view of a cross-section through a carrier 1 on which is arranged a housing 2. Carrier 1 is of a composite type and consists of metal tracks 3, intermediate spaces 4 of which are filled with epoxy during the manufacture of housing 2. The side of carrier 1 remote from housing 2 is not completely flat, and during feeding of the liquid epoxy is generally covered by a foil layer. A carrier 1 of the shown type is applied inter alia for the production of so-called leadless packages.

Figure 2A:
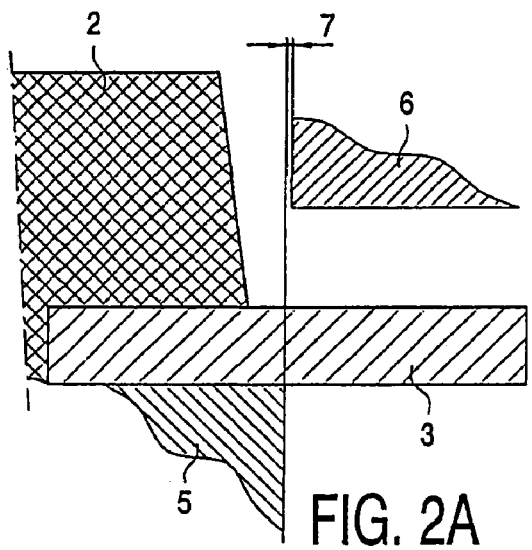
FIGS. 2a and 2b show side views of cross-sections through a part of a carrier with housing arranged thereon prior to the performing of a separation operation according to the prior art.
Figure 2B:
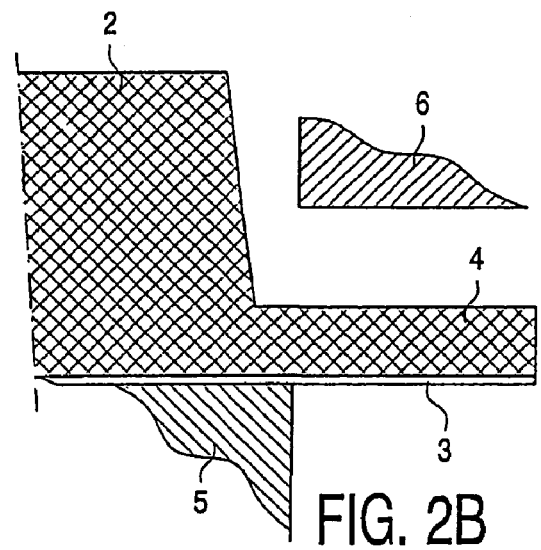

FIG. 2a shows a cross-section through carrier 1 and housing 2 which is perpendicular to the cross-section as shown in FIG. 1. For the separation of a part of carrier 1 from the remaining part of carrier 1 enclosing this part according to the prior art, the carrier 1 is placed on a cutting plate 5. In the cross-section shown in this figure only one metal track 3 of carrier 1 is visible. Metal track 3 supports on cutting plate 5. A displaceable knife 6 is situated on the side of the carrier 1 remote from cutting plate 5. A narrow cutting gap 7 is situated between cutting plate 5 and knife 6. FIG. 2b shows a cross-section through carrier 1 and housing 2 parallel to the cross-section shown in FIG. 2a, wherein an epoxy-filled intermediate space 4 of carrier 1 is visible. Clearly shown is that the epoxy-filled intermediate space 4 of carrier 1 does not support on cutting plate 5 but is situated at some distance therefrom. There is hereby still a limited view of a part of a metal track 3.

Figure 2C:
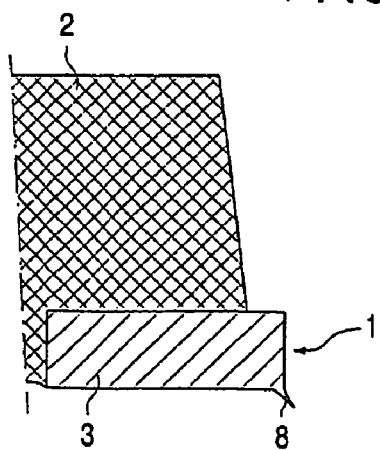
FIGS. 2c and 2d show side views of the cross-sections through the part of the carrier with the housing arranged thereon as shown in FIGS. 2a and 2b after performing of a separation operation according to the prior art.
Figure 2D:
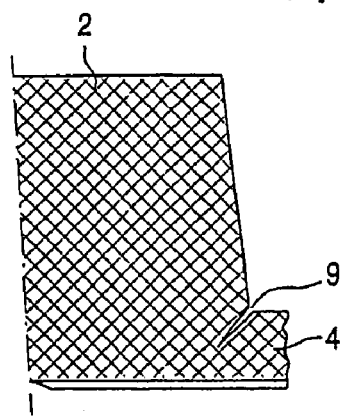

FIG. 2c shows a view of carrier 1 and housing 2 as shown in FIG. 2a, this time however after performing of the prior art separating operation. A drawback of the existing method is that the underside of the separated metal track 3 can be provided with a burr 8 protruding below the track 3. Burr 8 makes further processing of the separated product more difficult. As shown in FIG. 2d, there is the danger that due to lack of support by cutting plate 5 the intermediate space 4 filled with epoxy may begin to display (hairline) cracks 9 during the separation. Such cracks 9 are undesirable since they can result in a reduced lifespan of a separated product, they can make the dimensions of the separated product unmanageable, and so on.

Figure 3A:
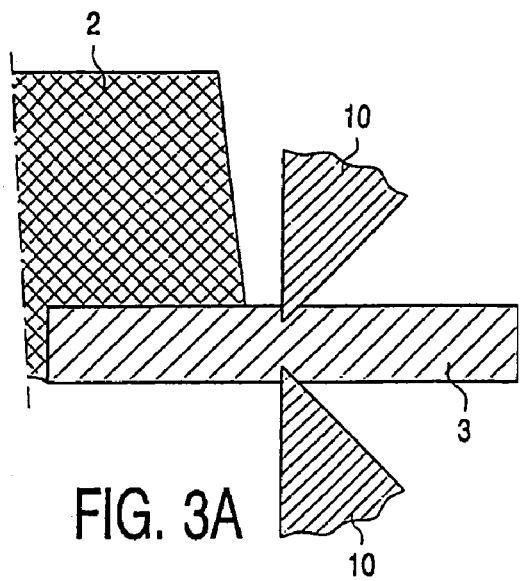
FIG. 3a is a side view of a cross-section through a part of a carrier with housing arranged thereon prior to performing the processing step forming part of the present invention wherein a notched line is arranged in the carrier.

FIG. 3a shows a processing step in the separation of a product according to the present invention. Both the metal tracks 3 and the epoxy-filled intermediate spaces 4 of carrier 1 are provided with notched edges 11 by notching members 10 ("notching punches"). Owing to the presence of notched edges 11 the final separating operation is less critical and a clearance 12 between cutting plate 5 and knife 6 can be given a larger dimension than the prior art clearance 7. This has the advantage that the tool life of both the cutting plate 5 and the knife 6 increases. Due to the epoxy-filled intermediate spaces 4 of carrier 1 a crack 13 will generally already occur in the relatively brittle epoxy when notched lines 11 are arranged. Here also the definitive separating operation is less critical.

Figure 3B:
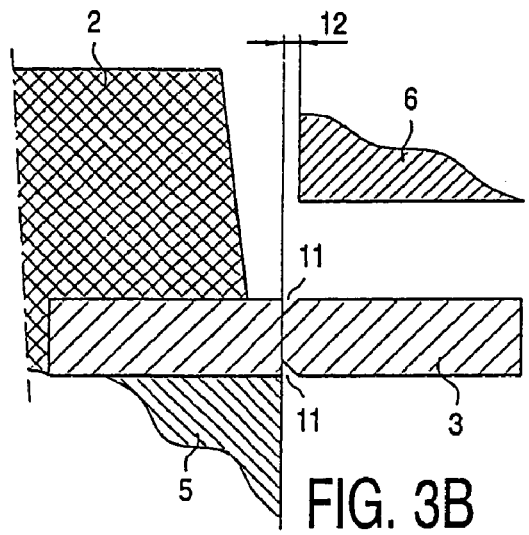
FIGS. 3b and 3c are side views of cross-sections through the part of the carrier with housing arranged thereon as shown in FIG. 3a prior to performing the definitive separating operation as according to the present invention.
Figure 3C:
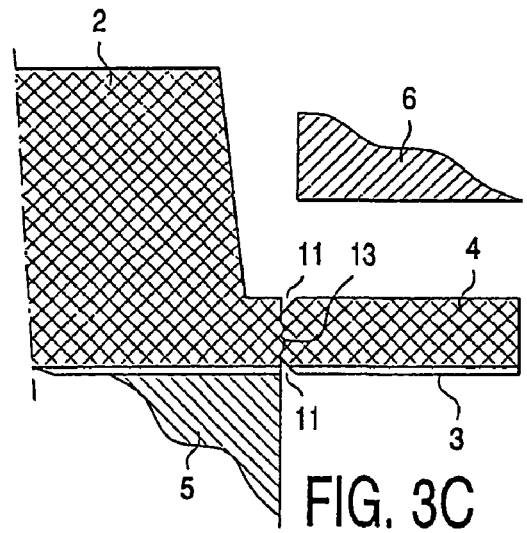
Figure 3D:
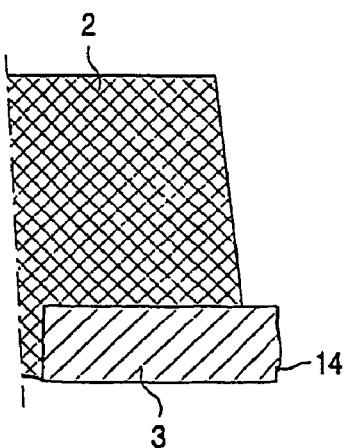
FIGS. 3d and 3e show side views of the cross-sections through the part of the carrier with the housing arranged thereon as shown in FIGS. 3b and 3c after performing a separating operation according to the present invention.
Figure 3E:
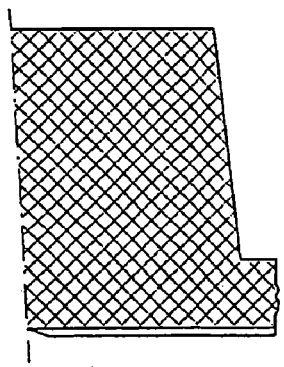

FIG. 3d shows a view of carrier 1 and housing 2 as shown in FIG. 3b, here however after performing the separating operation according to the present invention. The drawback of the prior art method of the burr 8 protruding from the underside of the separated metal track 3 has been obviated in that a burr 14 will develop at a distance from a flat side of metal track 3. FIG. 3e shows carrier 1 and housing 2 as show in FIG. 3c, here however after performing the separating operation according to the present invention. Owing to the crack 13 which has already developed in the epoxy-filled intermediate space 4, the definitive separating operation will not result in the forming of cracks 9 as shown in FIG. 2d.

Figure 4A:
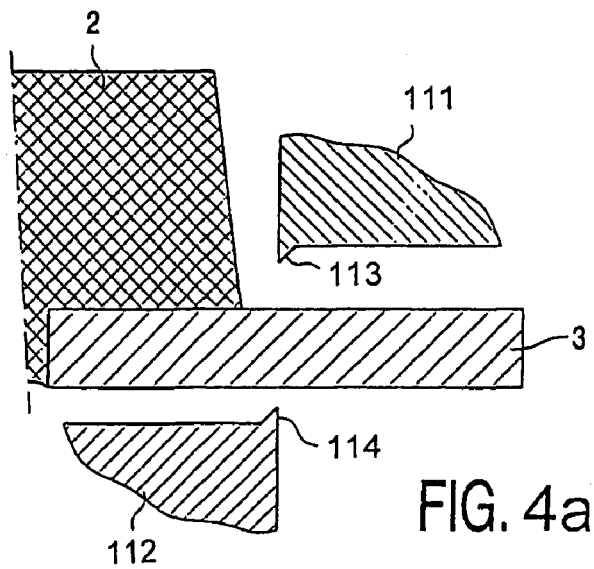
FIG. 4a shows a side view of a cross-section through a part of a carrier with housing arranged thereon before the cutting elements engage on the carrier in accordance with a particular preferred embodiment of the present invention.
Figure 4B:
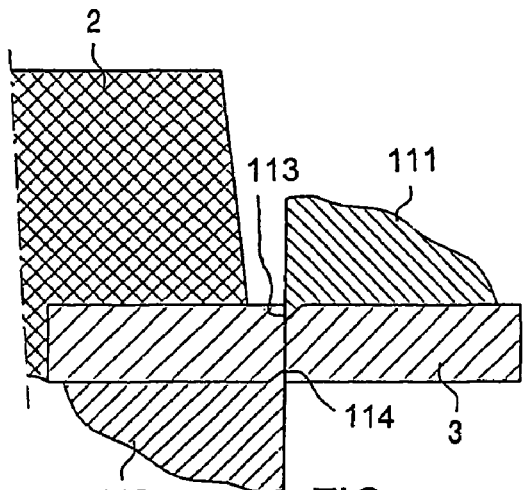
FIGS. 4b and 4c show side views of cross-sections through the part of the carrier with housing arranged thereon as shown in FIG. 4a during the first part of a single stroke of the cutting elements, wherein the carrier is deformed by the standing cutting edges.
Figure 4C:
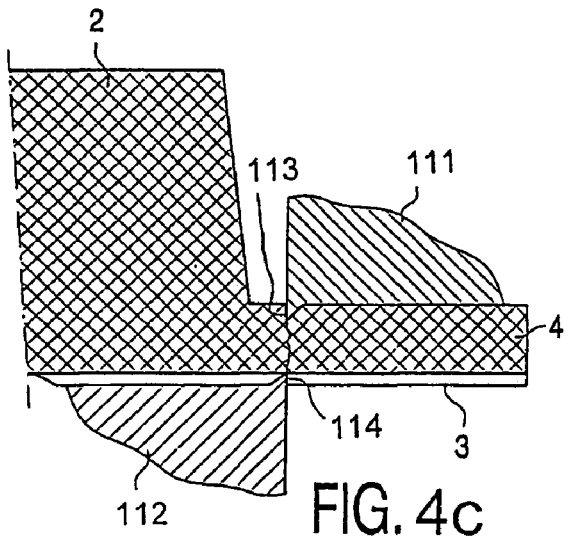
Figure 4D:
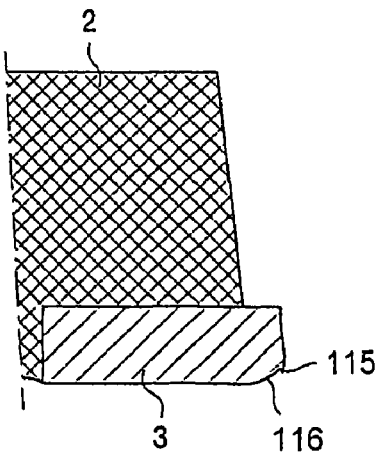
FIGS. 4d and 4e show side views of the cross-sections through the part of the carrier with the housing arranged thereon as shown in FIGS. 4b and 4c after performing of the separation operation.
Figure 4E:
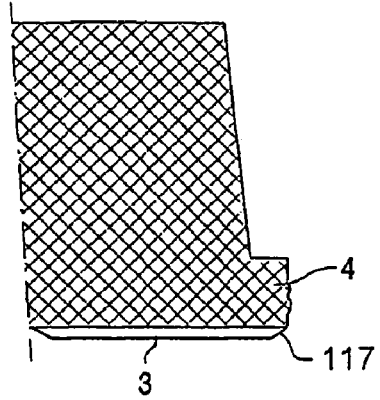

FIG. 4a shows a side view of a cross-section through a part of the metal track 3 of a carrier with the housing 2 arranged thereon before cutting elements 111,112 engage on metal track 3. Cutting elements 111,112 are provided with projecting or standing cutting edges 113,114. After cutting elements 111,112 have been moved further toward each other, the standing cutting edges 113,114 engage on metal track 3 such that it deforms permanently under the influence of the exerted pressure. It is noted with emphasis that cutting elements 111,112 do not deform the epoxy arranged in intermediate spaces 4 but are only brought into contact therewith. See respectively FIGS. 4b and 4c above. Cutting element 112 (also referred to as the cutting plate) hereby also comes to lie along the whole length of cutting edge 114 against metal carrier 3 respectively the recess 4 filled with epoxy. The chance of the problems as illustrated in FIGS. 2c and 2d is hereby minimized. A possible burr 115 on metal track 3 will thus develop at a distance from a flat side of metal track 3, at which position it has no adverse effect (see FIG. 4d for illustration). The deformed edge side 116 of metal track 3 can be readily distinguished. FIG. 4e shows a cross-section of the separated carrier part at the position of a recess filled with epoxy 4. Here also the deformed edge side 116 of metal track 3 can be distinguished; the recess 4 filled with epoxy is not deformed in angled manner by cutting edge 114.

Figure 5A:
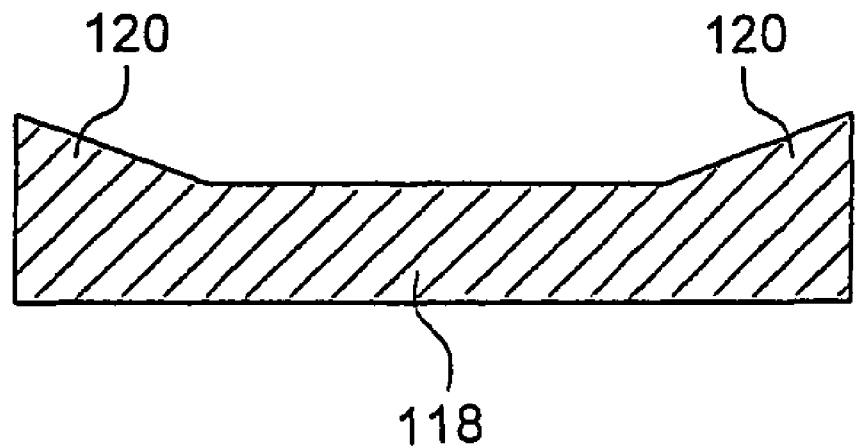
FIG. 5a shows a cross-section through a cutting element provided with a standing cutting edge.
Figure 5B:
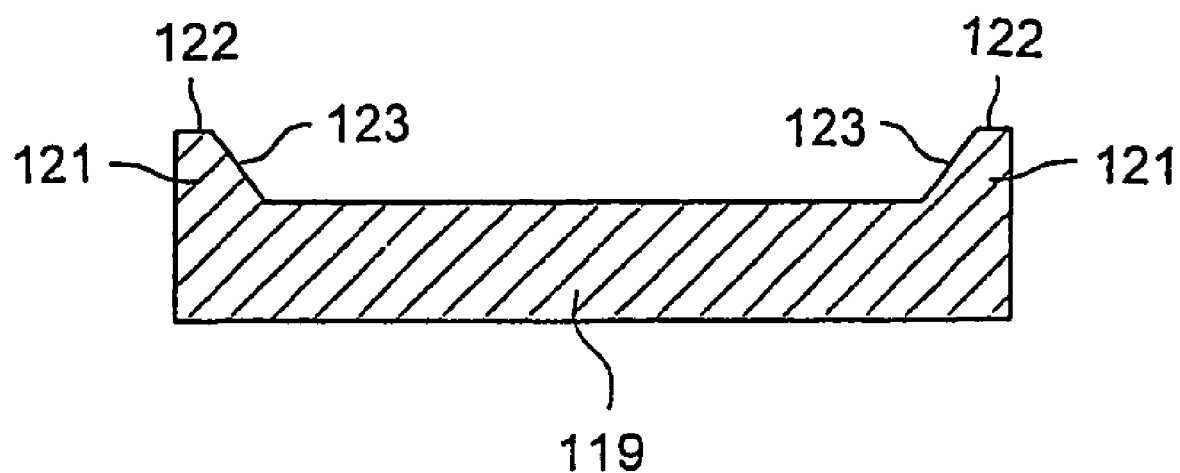
FIG. 5b shows a cross-section through an alternative embodiment variant of a cutting element provided with a standing cutting edge.

FIGS. 5a and 5b show cutting elements 118,119, of which the respective standing cutting edges 120,121 have alternative forms. The projecting cutting edges 120 of cutting element 118 have a form angled toward the base of cutting element 118. The projecting cutting edges 121 of cutting element 119 comprise edges 122 which run substantially parallel to a carrier for processing and which have connecting thereto sloping parts 123 formed at an angle to the base of cutting element 119.

The invention claimed is:

1. A method for punching a part from a carrier with a housing arranged thereon, comprising the steps of:
   (a) supporting the carrier with a cutting plate engaged on a first side of the carrier;
   (b) engaging a second side of the carrier with a cutting member;
   (c) arranging a notched line in the part to a depth less than the thickness of the part on at least one side of the part along at least a part of the length of a separating edge;
   (d) said notched line arranged to a depth so that the notched line levels any differences in the height of surfaces on said first side of the carrier, thereby resulting in even support by the cutting plate in step (a); and
   (e) performing a punching operation.

2. The method as claimed in claim 1, wherein the notched line is arranged by pressing a notching tool into the part.

3. The method as claimed in claim 1, wherein the notched lines are arranged on two sides of the carrier at the position of the separating edge to be arranged.

4. The method as claimed in claim 1, wherein the punching operation is performed such that the mutual distance between the cutting member and the cutting plate during performing of the punching operation is greater than 0.025 mm.

5. The method as claimed in claim 1, wherein the carrier, which carrier contains a carrier part with openings on the side of the carrier remote from the housing which are filled with encapsulating material, is engaged on two sides by cutting elements provided with at least one cutting edge, which cutting elements are subsequently moved toward each other such that the carrier part is separated from the remaining part of the carrier, and wherein before the separation takes place the cutting edge projecting relative to a base of the cutting element is pressed into the carrier such that the carrier deforms permanently.

6. The method as claimed in claim 5, wherein the carrier is placed on one side on a first cutting element provided with a recess and a second cutting element having a cutting edge with dimensions which correspond with the dimensions of the recess in the first cutting element is moved toward the first cutting element.

7. The method as claimed in claim 5, wherein the projecting cutting edge of a cutting element is pressed into the contact side of the carrier with the cutting element.

8. The method as claimed in claim 5, wherein after performing of the punching operation the cutting elements are moved apart and the separated carrier part is released from the cutting elements, wherein one side of the carrier part connecting onto the separation edge is provided with a deformation.

9. The method as claimed in claim 8, wherein the carrier part on the side of the carrier remote from the housing connecting onto the separation edge is provided with a deformation.

10. An apparatus for punching a part from a carrier with a housing arranged thereon, comprising:
    means for positioning the carrier;
    a cutting plate supporting the carrier and having a cutting edge projecting at an angle toward a base of the cutting plate;
    a cutting member movable relative to the cutting plate; and
    notching means for arranging a notched line to a depth less than the thickness of the part on at least one side in the part at the position of a separating edge to be arranged thereafter in the carrier wherein the notched line levels differences in height on the side of the carrier supported by the cutting plate and wherein the cutting plate and cutting member are movable on opposing sides of the separating edge.

11. The apparatus as claimed in claim 10, wherein the notching means are coupled to drive means for displacing the notching means relative to a carrier placeable in the apparatus.

12. The apparatus as claimed in claim 10, wherein the notching means comprise at least two notching members displaceable relative to each other for engaging on two opposite sides of a carrier.

13. The apparatus as claimed in claim 10, wherein the means for positioning the carrier are formed by the cutting plate.

14. The apparatus as claimed in claim 10, wherein the apparatus is provided with control means for controlled displacement of the notching means.

15. An apparatus for removing a part from a carrier with a housing arranged thereon, which part contains openings on the side of the carrier remote from the housing which are filled with encapsulating material, comprising cutting elements provided with at least one cutting edge for engaging the carrier wherein the carrier is engaged on two sides, which cutting elements are displaceable relative to each other such that the part can be separated from the carrier, wherein at least one of the cutting elements comprises a cutting edge and wherein at least one of the cutting elements supports the carrier, said cutting edge projecting at an angle toward a base of the cutting element for applying a notch in the part on at least one side at the position of a separating edge to be arranged thereafter that levels differences in height on the side of the carrier supported by the cutting element and wherein the cutting elements are displaceable relative to each other on opposing sides of the separating edge.

16. The apparatus as claimed in claim 15, wherein the projecting cutting edge comprises an edge running substantially parallel to a carrier and a sloping part connecting thereto and having a form at an angle to the base of the cutting element.

* * * * *